United States Patent
Yoshikawa et al.

(10) Patent No.: US 12,018,401 B2
(45) Date of Patent: Jun. 25, 2024

(54) GALLIUM OXIDE SINGLE CRYSTAL PARTICLE AND METHOD FOR PRODUCING THE SAME

(71) Applicant: NGK Insulators, Ltd., Nagoya (JP)

(72) Inventors: Jun Yoshikawa, Nagoya (JP); Miho Maeda, Nagoya (JP); Hiroyuki Shibata, Okazaki (JP)

(73) Assignee: NGK INSULATORS, LTD., Nagoya (JP)

(*) Notice: Subject to any disclaimer, the term of this patent is extended or adjusted under 35 U.S.C. 154(b) by 0 days.

(21) Appl. No.: 18/067,834

(22) Filed: Dec. 19, 2022

(65) Prior Publication Data

US 2023/0122462 A1    Apr. 20, 2023

Related U.S. Application Data

(63) Continuation of application No. PCT/JP2021/035808, filed on Sep. 29, 2021.

(30) Foreign Application Priority Data

Oct. 8, 2020  (JP) ................. 2020-170500
Apr. 27, 2021 (JP) ................. 2021-075003

(51) Int. Cl.
    *C30B 29/16*   (2006.01)
    *C30B 7/10*    (2006.01)
(52) U.S. Cl.
    CPC ........... *C30B 29/16* (2013.01); *C30B 7/10* (2013.01)

(58) Field of Classification Search
    None
    See application file for complete search history.

(56) References Cited

FOREIGN PATENT DOCUMENTS

| JP | 2012-162432 A | 8/2012 |
| JP | 2014-072533 A | 4/2014 |
| JP | 2016-025256 A | 2/2016 |
| JP | 2020-066567 A | 4/2020 |

OTHER PUBLICATIONS

English translation of Xia et al. CN-103469299 (Year: 2013).*
English translation of Choi et al. KR-20200102617 (Year: 2020).*
English translation of the International Preliminary Report on Patentability (Chapter I) dated Apr. 20, 2023 (Application No. PCT/JP2021/035808).
J.P. Remeika et al., "Growth of $\alpha$-$Ga_2$-$O_3$ Single Crystals at 44 Kbars," *Applied Physics Letters*, Feb. 15, 1966, vol. 8, No. 4, pp. 87-88.
International Search Report and Written Opinion (Application No. PCT/JP2021/035808) dated Nov. 22, 2021.
Elaheh Ahmadi et al., "Material Issues and Devices of $\alpha$-$\beta$-$Ga_2o_3$," Journal of Applied Physics, 2019, vol. 126, 160901-1-160901-17.
Japanese Office Action (with English translation) dated Jan. 30, 2024 (Application No. 2022-555394).

* cited by examiner

*Primary Examiner* — Ronak C Patel
(74) *Attorney, Agent, or Firm* — BURR PATENT LAW, PLLC

(57) ABSTRACT

A gallium oxide single crystal particle according to the present invention is an $\alpha$-$Ga_2O_3$ single crystal particle and has a diameter and a height that exceed 100 μm.

7 Claims, 4 Drawing Sheets

GALLIUM OXIDE SINGLE CRYSTAL PARTICLE AND METHOD FOR PRODUCING THE SAME

BACKGROUND OF THE INVENTION

1. Field of the Invention

The present invention relates to a gallium oxide single crystal particle and a method for producing the gallium oxide single crystal particle.

2. Description of the Related Art

Attention has been focused on the use of gallium oxide ($Ga_2O_3$) as a material for semiconductors. Gallium oxide is known to have five crystal forms: α, β, γ, δ, and ε. Among these, α-$Ga_2O_3$, which is a metastable phase, has been considered as a promising material for power semiconductors because it has a considerably large band gap (5.3 eV). For example, PTL 1 discloses a semiconductor device that includes a substrate having a corundum crystal structure, a semiconductor layer having a corundum crystal structure, and an insulation film having a corundum crystal structure. In PTL 1, an example in which an α-$Ga_2O_3$ film is disposed on a sapphire substrate as a semiconductor layer is described. PTL 2 discloses a semiconductor device that includes an n-type semiconductor layer including a crystalline oxide semiconductor having a corundum structure, the crystalline oxide semiconductor serving as a principal component; a p-type semiconductor layer including an inorganic compound having a hexagonal crystal structure, the inorganic compound serving as a principal component; and an electrode. In Examples of PTL 2, it is disclosed that a diode is prepared by forming an α-$Ga_2O_3$ film having a corundum structure, which is a metastable phase, as an n-type semiconductor layer and an α-$Rh_2O_3$ film having a hexagonal crystal structure, which serves as a p-type semiconductor layer, on a c-plane sapphire substrate. Furthermore, it is considered that α-$Ga_2O_3$ can also be applied to fluorescent materials.

CITATION LIST

Patent Literature

PTL1: JP2014-72533A
PTL2: JP2016-25256A

SUMMARY OF THE INVENTION

A large α-$Ga_2O_3$ single crystal particle has not been known.

The present invention was made in order to address the issue. A primary object of the present invention is to provide a large gallium oxide single crystal particle.

A gallium oxide single crystal particle according to the present invention is an α-$Ga_2O_3$ single crystal particle and has a diameter and a height that exceed 100 μm.

DETAILED DESCRIPTION OF THE INVENTION

Figure 1:
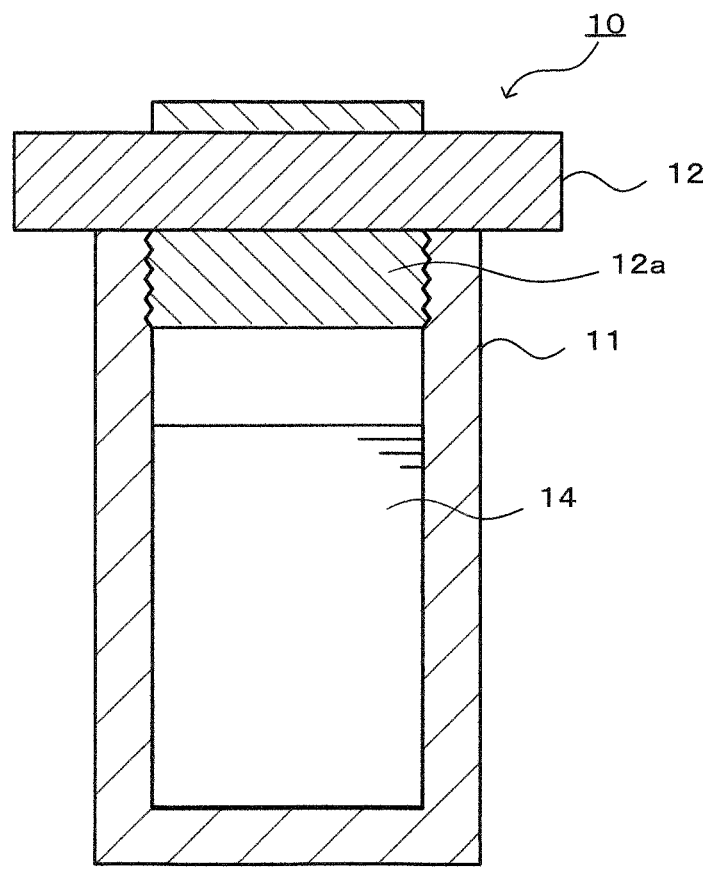
FIG. 1 is a longitudinal cross-sectional view of a pressure-resistant container 10.
Figure 2:
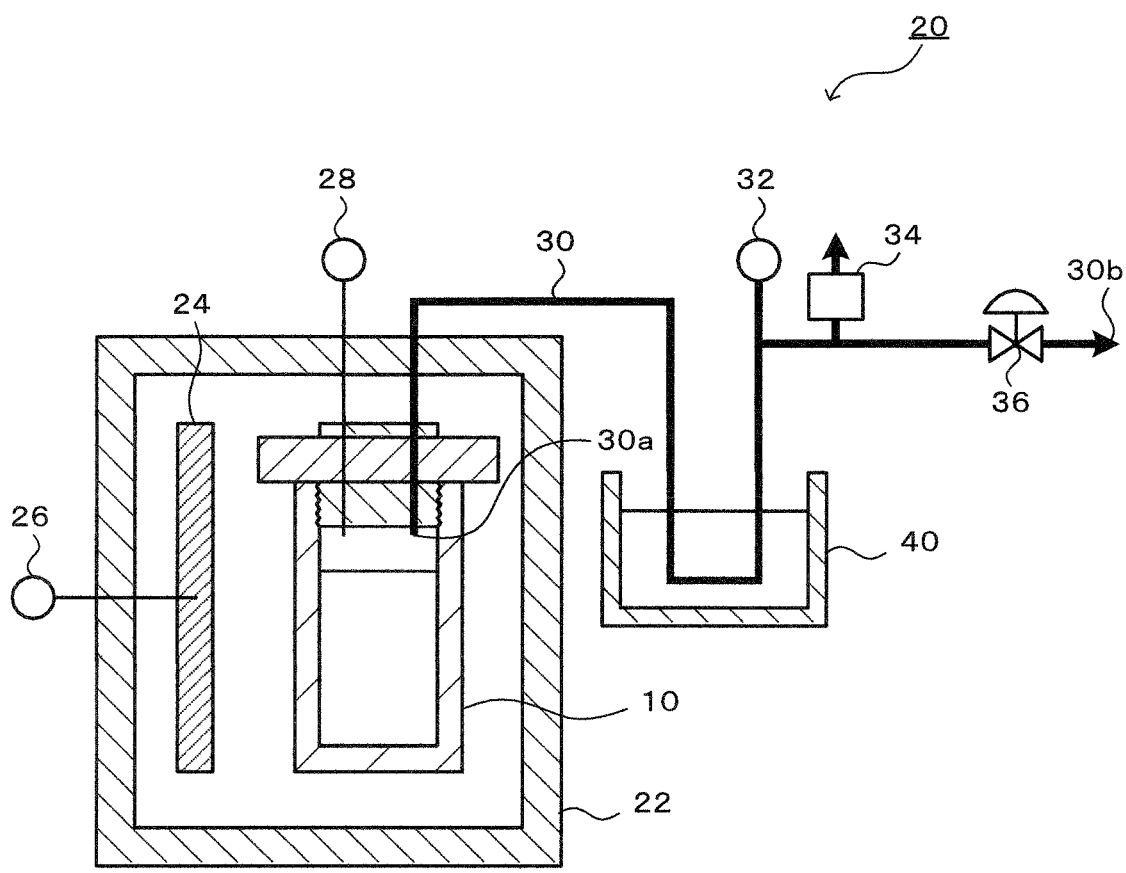
FIG. 2 is a schematic diagram illustrating a hydrothermal synthesis system 20.

A preferable embodiment of the present invention is described below with reference to the attached drawings. FIG. 1 is a longitudinal cross-sectional view of a pressure-resistant container 10. FIG. 2 is a schematic diagram illustrating a hydrothermal synthesis system 20.

A gallium oxide single crystal particle according to this embodiment is an α-$Ga_2O_3$ single crystal particle and has a diameter and a height that exceed 100 μm (preferably exceed 200 μm).

The Raman peak of the gallium oxide single crystal particle according to this embodiment which is the closest to a Raman shift of 690 $cm^{-1}$ preferably has a half-width of 20 $cm^{-1}$ or less.

The surface of the gallium oxide single crystal particle according to this embodiment preferably has a surface roughness Ra of 100 nm or less.

In the gallium oxide single crystal particle according to this embodiment, the proportion of Ga atoms to O atoms is preferably 0.70 to 1.00. Note that the proportion of Ga atoms to O atoms in a gallium oxide ($Ga_2O_3$) crystal with no oxygen deficiency is 0.67.

A method for producing the gallium oxide single crystal particle according to this embodiment is described below. The method for producing the gallium oxide single crystal particle includes, for example, adjusting the pH of an aqueous solution including a Ga ion preferably to 9.0 to 11.0 and bringing the aqueous solution into a supercritical state having a temperature of 390° C. or more (preferably, 400° C. or more) and a pressure of 22.1 MPa or more. The above pH adjustment enables selective formation of an α-$Ga_2O_3$ single crystal particle.

Examples of the aqueous solution including a Ga ion include an aqueous halogenated gallium solution, an aqueous gallium nitrate solution, an aqueous gallium sulfate solution, and an aqueous gallium hydroxide solution. Examples of the halogenated gallium include gallium chloride, gallium bromide, and gallium iodide. The pH of the aqueous solution including a Ga ion is preferably adjusted to 9.0 to 11.0 (more preferably 9.6 to 10.4 and further preferably 9.8 to 10.2) with a pH adjuster. The pH adjuster may be an aqueous solution of an alkali metal hydroxide (e.g., an aqueous KOH solution) or an aqueous solution including an ammonium ion (e.g., ammonium water). The Ga ion concentration in the aqueous solution including a Ga ion may be, for example, but not limited to, 0.1 M or more and 10 M or less. Gallium oxide hydroxide (GaOOH) may optionally be added to the aqueous solution including a Ga ion. In such a case, gallium oxide hydroxide also serves as a Ga source and, consequently, the amount of α-$Ga_2O_3$ crystals produced can be increased. The addition of gallium oxide hydroxide may be done either prior or subsequent to the pH adjustment. The aqueous solution including a Ga ion may optionally include alkali metal elements (alkali metal ions). Examples of the alkali metals include Li, Na, and K.

For bringing the aqueous solution including a Ga ion into a supercritical state having a temperature of 390° C. or more and a pressure of 22.1 MPa or more, it is preferable to charge the aqueous solution including a Ga ion into a pressure-resistant container and set the temperature and pressure to 390° C. or more and 22.1 MPa or more, respectively. The pressure is determined by the inner capacity of the pressure-resistant container, the amount of the aqueous solution charged in the pressure-resistant container, the temperature inside the pressure-resistant container, and the settings of a pressure control valve. The amount of time during which a reaction is conducted may be, for example, but not limited to, 0.5 hours or more and 100 hours or less. After the reaction has been terminated, the temperature inside the pressure-resistant container is reduced and the product, that is, gallium oxide single crystal particles, is then removed from the pressure-resistant container. A seed crystal may be immersed in the aqueous solution including a Ga ion. Examples of the seed crystal include an α-$Ga_2O_3$ single crystal and, in particular, an α-$Ga_2O_3$ single crystal having a diameter and a height that exceed 100 μm.

In the case where a gallium oxide single crystal particle including a dopant is to be formed, an ion that corresponds to the dopant may be added to the aqueous solution including a Ga ion. Examples of the dopant include Group-14 elements, such as carbon (C), silicon (Si), germanium (Ge), tin (Sn), and lead (Pb). The electrical conductivity of the gallium oxide single crystal particle can be controlled by adding the dopant to the gallium oxide single crystal particle.

FIG. 1 illustrates an example of the pressure-resistant container. A pressure-resistant container 10 illustrated in FIG. 1 is made of a stainless steel and includes a closed-end cylindrical container main body 11 and a lid 12 including a protrusion 12a including a male thread formed thereon, the lid 12 being screwed into a female thread formed at the opening of the container main body 11. The inner capacity of the pressure-resistant container 10 is preferably 50 mL or more. The container main body 11 of the pressure-resistant container 10 contains an aqueous solution 14 including a Ga ion. The pH of the aqueous solution 14 is preferably adjusted to 9.0 to 11.0 (more preferably 9.6 to 10.4 and further preferably 9.8 to 10.2).

FIG. 2 is a schematic diagram illustrating a hydrothermal synthesis system 20. The hydrothermal synthesis system 20 includes an electric furnace housing 22 and a pressure-resistant container 10 disposed in the electric furnace housing 22. A heater 24 and a thermocouple 26 for measurement of furnace temperature are attached to the inside of the electric furnace housing 22. A thermocouple 28 for pressure-resistant container, which measures the inside temperature of the pressure-resistant container 10, is attached to the pressure-resistant container 10. The power fed to the heater 24 is controlled such that the furnace temperature measured with the thermocouple 26 for measurement of furnace temperature reaches a preset temperature. A pipe 30 is connected to the pressure-resistant container 10. An end 30a of the pipe 30 is located inside the pressure-resistant container 10, while the other end 30b of the pipe 30 is located in the air. The pipe 30 is cooled with cooling water stored in a cooling water tank 40. The segment of the pipe 30 which extends from the cooling water tank 40 to the other end 30b is provided with a manometer 32, a safety valve 34, and a pressure control valve 36 which are attached to the segment. The heater 24 heats the entirety of the pressure-resistant container 10 such that the inside temperature of the pressure-resistant container 10 reaches 390° C. or more (preferably 400° C. or more) and the inside pressure of the pressure-resistant container 10 reaches 22.1 MPa or more. Since the inside pressure of the pressure-resistant container 10 is determined by the inner capacity of the pressure-resistant container 10, the amount of the aqueous solution 14 charged in the pressure-resistant container 10, the inside temperature of the container, and the settings of the pressure control valve 36, the amount of the aqueous solution 14 charged in the pressure-resistant container 10 is adjusted such that the inside pressure of the container reaches 22.1 MPa or more when the inside temperature of the container is 390° C. or more. Holding is performed for a predetermined amount of time in the above state. Subsequently, after the inside temperature of the pressure-resistant container 10 has been reduced to room temperature, the solution containing crystals is removed from the pressure-resistant container 10. Then, rinsing is performed with pure water and, subsequently, drying is performed with a dryer.

As described above, the gallium oxide single crystal particle according to this embodiment is a large particles that has not been known in the related art and is therefore supposed to be used in a novel application as a material for semiconductors.

When the half-width of a Raman peak of the gallium oxide single crystal particle according to this embodiment which is the closest to a Raman shift of 690 $cm^{-1}$ is 20 $cm^{-1}$ or less, suitable crystallinity is achieved. This may contribute to the improvement of the performance of power devices, catalysts, and the like.

When the surface roughness Ra of the surface of the gallium oxide single crystal particle according to this embodiment is 100 nm or less, it becomes easy to form a drift layer having a controlled carrier concentration or an electrode of a power device due to the high surface smoothness.

When the proportion of Ga atoms to O atoms included in the gallium oxide single crystal particle according to this embodiment is 0.70 to 1.00, electrical conductivity is readily produced since the gallium oxide single crystal particle includes a certain amount of oxygen deficiency. This gallium oxide single crystal particle is suitable for power devices.

In the case where α-$Ga_2O_3$ crystals are used for producing power semiconductors or the like which are required to have high resistance to pressure, they are required to have a high crystal quality since the dielectric breakdown electric field properties vary by the crystal quality. Thus, it is preferable that the half-width of an X-ray rocking curve of at least one of the (006) or (104) planes of the gallium oxide single crystal particle according to this embodiment be 300 arcsec or less. In other words, it is preferable that the gallium oxide single crystal particle according to this embodiment have sufficiently high crystallinity (crystal quality). The half-width of the X-ray rocking curve of the (006) plane is more preferably 110 arcsec or less and is further preferably 70 arcsec or less. The half-width of the X-ray rocking curve of the (104) plane is more preferably 260 arcsec or less and is further preferably 80 arcsec or less.

The contents of the alkali metal elements in the gallium oxide single crystal particle according to this embodiment are each preferably $1.2 \times 10^{15}$ to $1.0 \times 10^{18}$ atoms/$cm^3$. In such a case, the α-$Ga_2O_3$ crystal can be formed with consistency while the formation of the other phases, such as β-$Ga_2O_3$, is suppressed. Examples of the alkali metal elements include Li, Na, and K. It is more preferable that the total of the contents of the alkali metal elements be $1.2 \times 10^{15}$ to $1.0 \times 10^{18}$ atoms/$cm^3$.

It is needless to say that the present invention is not limited by the foregoing embodiment and can be implemented in various aspects without departing from the technical scope of the present invention.

EXAMPLES

Examples of the present invention are described below. Note that the present invention is not limited by Examples below.

Example 1

1. Hydrothermal Synthesis

A 0.1 M aqueous solution of gallium nitrate octahydrate (produced by Kishida Chemical Co., Ltd.) was prepared. The pH of the aqueous solution was adjusted to 10.0 using a 1 M aqueous KOH solution as a pH adjuster. Hereby, a raw material solution was prepared. Subsequently, 45 mL of the raw material solution was charged into a pressure-resistant container 10 (inside diameter: 19 mm, inner capacity: 50 mL) made of SUS316 which is illustrated in FIG. 1. The container was then hermetically sealed. The pressure-resistant container 10 was placed in an electric furnace housing 22 included in the hydrothermal synthesis system 20 illustrated in FIG. 2. The pressure control valve 36 was preset such that the inside pressure of the pressure-resistant container 10 was 24.0 MPa. Then, the entirety of the pressure-resistant container 10 was heated with a heater 24 included in the electric furnace housing 22 such that the inside temperature of the pressure-resistant container 10 reached 420° C. At this time, the inside pressure of the pressure-resistant container 10 was 24.0 MPa. Holding was performed for five hours in this state. Subsequently, the inside temperature of the pressure-resistant container 10 was reduced to room temperature. The resulting particle s were removed from the pressure-resistant container 10, rinsed with pure water, and subsequently dried with a dryer.

2. Evaluation

(1) Crystal Phase

Figure 3:
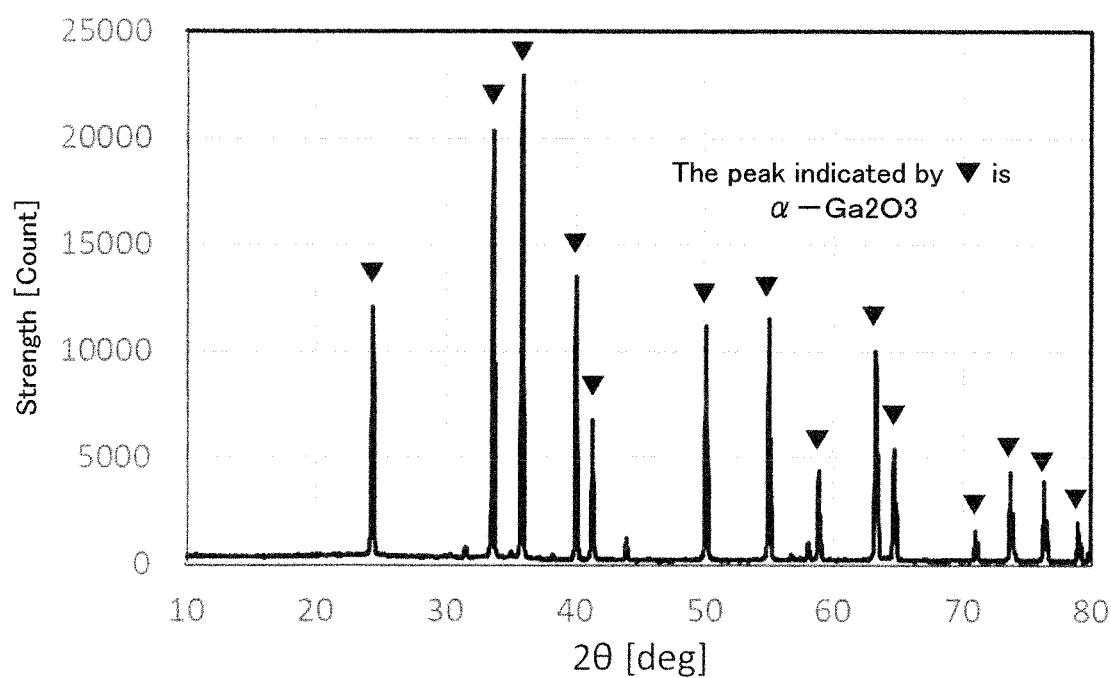
FIG. 3 is an XRD profile of a product prepared in Example 1.

An XRD profile of the particles prepared in 1. above was obtained with an XRD apparatus ("RINT-TTR III" produced by Rigaku Corporation) under the following conditions. As a result, the XRD profile illustrated in FIG. 3 was obtained. As illustrated in FIG. 3, the primary phase of the product was identified as $\alpha$-$Ga_2O_3$.

X-ray tube: Cu target
Tube voltage: 50 kV
Tube current: 300 mA
2θ/θ method
2θ range: 10° to 80°

(2) Microstructure and Composition

Figure 4:
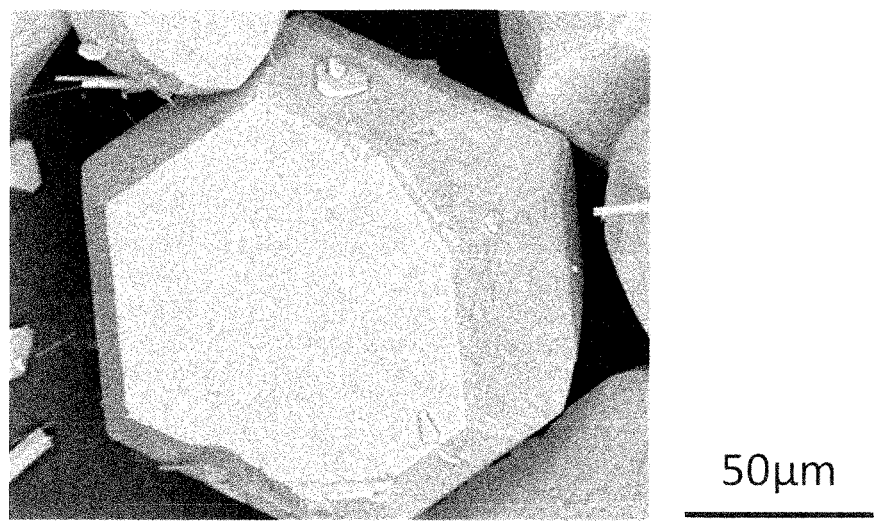
FIG. 4 is an SEM image of the product prepared in Example 1.

The particles prepared in 1. above were inspected with an electron scanning microscope (SEM, JSM-IT500 produced by JEOL Ltd.) and the crystals illustrated in FIG. 4 were observed. No holes were observed in the crystals. For typical one of the particles, the composition of the surface of the particle was confirmed by point analysis using an EDS device attached to the SEM. As a result, the elements listed in Table 1 were detected. The proportion of Ga atoms to O atoms was 0.79, that is, fell within the range of 0.70 to 1.00.

(3) Particle Shape and Surface Roughness

The shape (diameter and height) of the particle s prepared in 1. above was determined by the following method with a shape analysis laser microscope (VK-X150 produced by Keyence Corporation). The particles were scattered on a flat metal Al plate coated with DLC (diamond-like carbon). Typical one of the particles which did not overlap another particle was inspected and the following measurement was conducted. On the basis of an image of the particle captured from above, the diameters of the particle in the vertical and horizontal directions were measured and the average thereof was calculated as the diameter of the particle. Furthermore, "profile measurement" was done with the software attached to the laser microscope. The maximum height of the particle from the surface of the DLC-coated metal Al plate was considered as the height of the particle. Table 1 lists the diameter and height of the particle. The diameter and height of the particle both exceeded 100 μm. Moreover, the surface roughness Ra of the particle surface was measured with the same shape analysis laser microscope as described above in the "linear roughness measurement" mode of the attached software. The length of the measurement region was 10 μm. As a result, the surface roughness Ra listed in Table 1 was obtained. The surface roughness Ra was 34 nm, that is, 100 nm or less.

(4) Half-Width of Raman Peak

Figure 5:
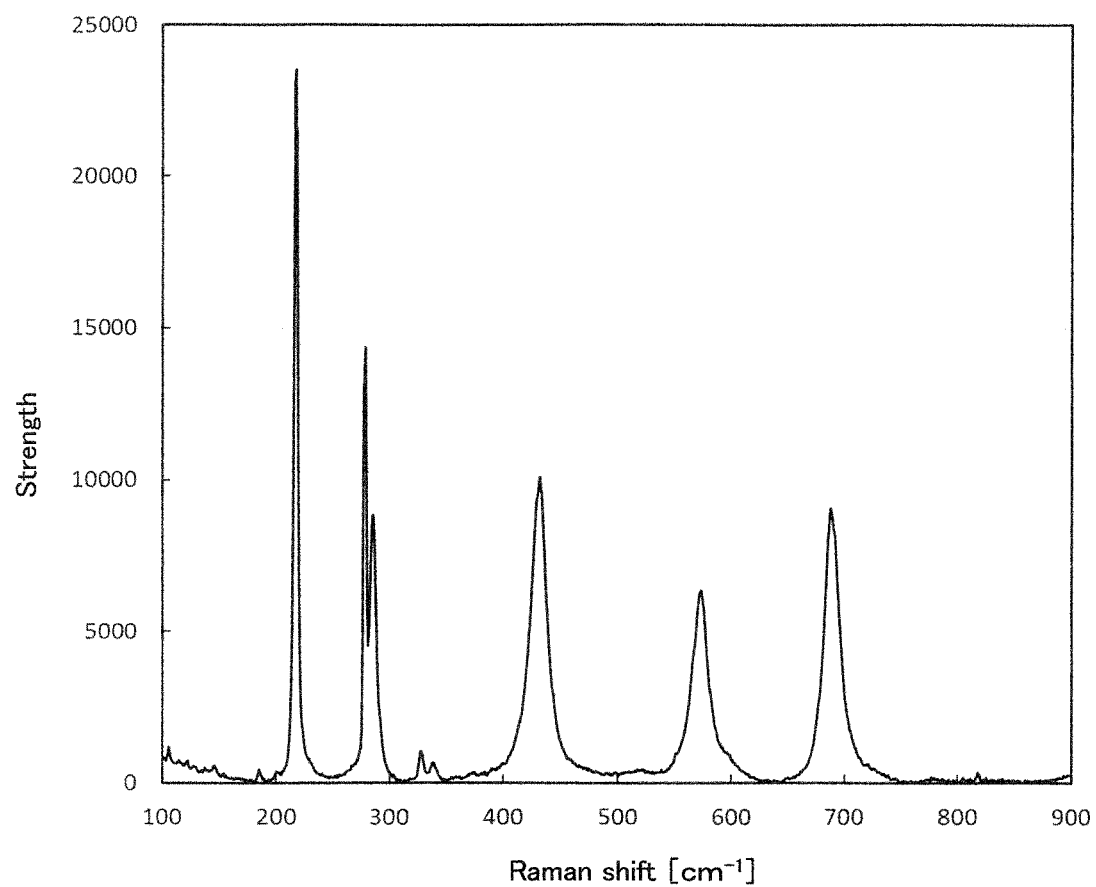
FIG. 5 is a Raman spectrum of the product prepared in Example 1.

The Raman spectrum of the particles prepared in 1. above was determined. The particle inspected was different from that inspected in 2. (2) and (3) above. The Raman spectrum was measured with a laser-Reman spectrometer LabRAM ARAMIS produced by HORIBA, Ltd. using operation software LabSpec (Ver. 5.78). The optical system used was a Czerny-Turner spectrometer and a backscattering spectrometer. The light source used was a diode pumped solid-state laser (DPSS, 532 nm). Prior to the measurement of the sample, calibration was done using a Si wafer. In the measurement of the Raman spectrum of the particles, the laser output was adjusted to 24 mW, Hole (confocal hole diameter) was set to 400 μm, the center wavenumber of the spectrometer was set to 520 $cm^{-1}$, Slit was set to 100 μm, the grating was set to 1800 gr/mm, the objective lens was set to 100-fold, and the measurement was performed in a point analysis mode. The exposure time was set to 60 seconds, the number of integration was set to 2, and the wavenumber range was set to 100 to 900 $cm^{-1}$. The neutral density filter was set appropriately such that the count of the strongest peak fell within the range of 3000 or more and 50000 or less. Furthermore, a Ne lamp was used in the measurement and the resulting spectrum was corrected such that the wavenumber of the top of a peak resulting from the Ne lamp emission line was 278.28 $cm^{-1}$. The base line was corrected by setting "Type" to "Lines", "Degree" to "5", "Attach" to "No", and "Style" to "-" in the functions of the software LabSpec and in the "Auto" mode. The width of a peak of the resulting spectrum which was closest to a Raman shift of 690 $cm^{-1}$ at a height corresponding to ½ of the count of the peak top was measured as a half-width. Table 1 lists the results. FIG. 5 illustrates the Raman spectrum measured. The half-width of the particle was 20 $cm^{-1}$ or less.

Example 2 particles were synthesized under the same conditions as in Example 1, except that the pressure control valve 36 of the hydrothermal synthesis system 20 was set to 30.0 MPa and the inside pressure of the pressure-resistant container 10 at 420° C. was set to 30.0 MPa. An XRD spectrum of the particles was measured as in 2.(1) above, and the primary phase of the product was identified as $\alpha$-$Ga_2O_3$. Evaluations were made as in 2.(2) to (4) above. Table 1 lists the results. Specifically, the diameter and height of the particles exceeded 100 μm, the surface roughness Ra of the particles was 100 nm or less. The half-width of a Raman peak closest to a Raman shift of 690 $cm^{-1}$ was 20 $cm^{-1}$ or less. The atomic ratio of Ga/O fell within the range of 0.70 to 1.00. The results of SEM observation of the particles confirmed that holes were absent in the crystals.

Example 3

Particles were synthesized under the same conditions as in Example 2, except that the amount of time during which holding was performed at the highest temperature was changed to 24 hours. An XRD spectrum of the particles was measured as in 2.(1) above, and the primary phase of the product was identified as $\alpha$-$Ga_2O_3$. Evaluations were made as in 2.(2) to (4) above. Table 1 lists the results. Specifically, the diameter and height of the particles exceeded 100 μm, the surface roughness Ra of the particles was 100 nm or less. The half-width of a Raman peak closest to a Raman shift of 690 $cm^{-1}$ was 20 $cm^{-1}$ or less. The atomic ratio of Ga/O fell within the range of 0.70 to 1.00. The results of SEM observation of the particles confirmed that holes were absent in the crystals.

Example 4

Particles were synthesized under the same conditions as in Example 1, except that 20 mg of particles prepared under the conditions used in Example 3 were added to the raw material solution as seed crystals. An XRD spectrum of the particles was measured as in 2.(1) above, and the primary phase of the product was identified as α-$Ga_2O_3$. Evaluations were made as in 2.(2) to (4) above. Table 1 lists the results. Specifically, the diameter and height of the particles exceeded 100 μm, the surface roughness Ra of the particles was 100 nm or less. The half-width of a Raman peak closest to a Raman shift of 690 $cm^{-1}$ was 20 $cm^{-1}$ or less. The atomic ratio of Ga/O fell within the range of 0.70 to 1.00. The results of SEM observation of the particles confirmed that holes were absent in the crystals.

α-$Ga_2O_3$ was determined by performing smoothing of the profile with XRD analysis software ("LEPTOS" Ver 4.03 produced by Bruker-AXS) and subsequently performing peak searching. Table 2 lists the results.

(3) Contents of Alkali Metal Elements

The contents of the alkali metal elements (Li, Na, and K) in the vicinity of the surfaces of the particles were analyzed using a secondary ion mass spectrometer (SIMS). The D-SIMS analysis was conducted under the following conditions.

<D-SIMS Analysis Conditions>
  Apparatus: IMS-7f produced by CAMECA
  Primary ion species: $O_2^+$
  Primary ion acceleration voltage: 8.0 kV The contents of the alkali metal elements were determined by performing conversion into the unit "atoms/$cm^3$" using a $Ga_2O_3$ reference sample, preparing a depth profile, and calculating the average over the depth of 1 to 2 μm from the surface. Table 2 lists the results.

TABLE 1

| Examples | Diameters of particles [μm] | Heights of particles [μm] | Roughness of surface of particles [nm] | Raman Spectrum half-width [$cm^{-1}$] | Ga [at %] | O [at %] | Ga/O ratio |
|---|---|---|---|---|---|---|---|
| 1 | 125 | 105 | 34 | 17 | 44 | 56 | 0.79 |
| 2 | 156 | 112 | 18 | 15 | 42 | 58 | 0.72 |
| 3 | 180 | 147 | 77 | 19 | 48 | 52 | 0.92 |
| 4 | 234 | 210 | 10 | 16 | 44 | 56 | 0.79 |

Example 5

1. Hydrothermal Synthesis

A 0.1 M aqueous solution of gallium nitrate octahydrate was prepared as in Example 1. The pH of the aqueous solution was adjusted to 10.0 using a 1 M aqueous KOH solution as a pH adjuster. Hereby, a raw material solution was prepared. A hydrothermal synthesis was conducted under the same conditions as in Example 1, except that a pressure-resistant container made of HASTELLOY (registered trademark) C276 was used as the pressure-resistant container 10 illustrated in FIG. 1, the pressure control valve 36 of the hydrothermal synthesis system 20 was set to 30.0 MPa, the highest temperature was set to 410° C., and the amount of time during which holding was performed at the highest temperature was changed to 24 hours. The weight of the resulting crystals was 0.042 g.

2. Evaluations (1) Crystal phase, microstructure and composition, particle shape and surface roughness, and the half-width of a Raman peak were evaluated as in Example 1. The primary phase of the product was α-$Ga_2O_3$. Table 2 lists the other results.

(2) Half-Width of XRC Rocking Curve

The XRC of the (006) and (104) planes of the α-$Ga_2O_3$ particles were measured with an XRD apparatus (D8-DISCOVER produced by Bruker-AXS). Specifically, after alignment had been performed by adjusting 2θ, ω, χ, and φ such that peaks of the (006) or (104) plane of α-$Ga_2O_3$ could be observed, the measurement was conducted at a tube voltage of 40 kV, a tube current of 40 mA, an anti-scattering slit of 3 mm, at ω=20.0° to 20.4° in the measurement of the (006) plane or ω=16.5° to 17.5° in the measurement of the (104) plane, an ω step width of 0.001°, and a counting time of 0.5 seconds. The X-ray source used was a parallel beam of monochromatic light produced by converting CuKα radiation through a Ge(022) asymmetric reflection monochromator. The half-width of the resulting XRC profile of Example 6

A hydrothermal synthesis was performed as in Example 5, except that, in the preparation of the raw material solution, the pH of the 0.1 M aqueous solution of gallium nitrate octahydrate was set to 9.2 using a 1 M aqueous NaOH solution as a pH adjuster. The evaluations were made as in Example 5. The primary phase of the resulting crystals was α-$Ga_2O_3$. Table 2 lists the evaluation results.

Example 7

A hydrothermal synthesis was performed as in Example 5, except that, in the preparation of the raw material solution, the pH of the 0.1 M aqueous solution of gallium nitrate octahydrate was set to 10.5 using a 1 M aqueous LiOH solution as a pH adjuster. The evaluations were made as in Example 5. The primary phase of the resulting crystals was α-$Ga_2O_3$. Table 2 lists the evaluation results.

Example 8

A hydrothermal synthesis was performed as in Example 5, except that 0.325 g of gallium oxide hydroxide (produced by Kojundo Chemical Lab. Co., Ltd.) was added to the raw material solution used in Example 5. The evaluations were made as in Example 5. The primary phase of the resulting crystals was α-$Ga_2O_3$. The weight of the resulting crystals was 0.31 g. Table 2 lists the evaluation results.

As listed in Table 2, as for the α-$Ga_2O_3$ particles prepared in Examples 5 to 8, the diameter and height of the particles exceeded 100 μm, the surface roughness Ra of the particles was 100 nm or less. The half-width of a Raman peak closest to a Raman shift of 690 $cm^{-1}$ was 20 $cm^{-1}$ or less. The atomic ratio of Ga/O fell within the range of 0.70 to 1.00. The results of SEM observation of the particles confirmed that holes were absent in the crystals. The half-widths of the XRC rocking curves of the (006) and (104) planes were 300 arcsec or less. That is, sufficiently high crystallinity was confirmed. The contents of the alkali metal elements were $1.2 \times 10^{15}$ to $1.0 \times 10^{18}$ atoms/$cm^3$.

TABLE 2

| Examples | Diameters of particles [μm] | Heights of particles [μm] | Roughness of surface of particles [nm] | Raman Spectrum half-width [cm$^{-1}$] | Ga [at %] | O [at %] | Ga/O ratio | XRC half-width (006)surface [arcsec] | XRC half-width (104)surface [arcsec] | Amount of contents [atoms/cm$^3$] | | |
|---|---|---|---|---|---|---|---|---|---|---|---|---|
| | | | | | | | | | | Li | Na | K |
| 5 | 560 | 121 | 26 | 16 | 45 | 55 | 0.82 | 40.8 | 43.2 | 1.3E+15 | 5.9E+16 | 6.5E+16 |
| 6 | 918 | 169 | 45 | 18 | 43 | 57 | 0.75 | 67.2 | 73.0 | 5.7E+15 | 6.8E+16 | 3.0E+15 |
| 7 | 853 | 124 | 31 | 15 | 42 | 58 | 0.72 | 54.8 | 62.1 | 3.8E+16 | 4.6E+15 | 2.3E+15 |
| 8 | 365 | 112 | 36 | 19 | 44 | 56 | 0.79 | 109 | 255 | 3.4E+15 | 4.0E+17 | 8.4E+17 |

In the present specification, a numerical range expressed using "to" means the range specified by the minimum and maximum values described before and after "to", respectively.

The present application claims priority based on Japanese Patent Application No. 2020-170500 filed on Oct. 8, 2020, and Japanese Patent Application No. 2021-075003 filed on Apr. 27, 2021 and the entire contents of which are incorporated herein by reference.

What is claimed is:

1. A gallium oxide single crystal particle being an α-Ga$_2$O$_3$ single crystal particle,
    the gallium oxide single crystal particle having a diameter and a height that exceed 100 μm,
    wherein a Raman peak closest to a Raman shift of 690 cm$^{-1}$ has a half-width of 20 cm$^{-1}$ or less, and
    wherein a surface of the gallium oxide single crystal particle has a surface roughness Ra of 100 nm or less.

2. The gallium oxide single crystal particle according to claim 1,
    wherein a proportion of Ga atoms to O atoms is 0.70 to 1.00.

3. The gallium oxide single crystal particle according to claim 1,
    wherein an X-ray rocking curve of at least one of (006) or (104) planes has a half-width of 300 arcsec or less.

4. The gallium oxide single crystal particle according to claim 1,
    wherein a content of an alkali metal element is 1.2×10$^{15}$ to 1.0×10$^{18}$ atoms/cm$^3$.

5. A method for producing the gallium oxide single crystal particle according to claim 1, the method comprising:
    bringing an aqueous solution including a Ga ion, the aqueous solution having a pH of 9.0 to 11.0, into a supercritical state having a temperature of 390° C. or more and a pressure of 22.1 MPa or more to form an α-Ga$_2$O$_3$ single crystal particle having a diameter and a height that exceed 100 μm.

6. The method for producing a gallium oxide single crystal particle according to claim 5,
    wherein gallium oxide hydroxide is added to the aqueous solution before the aqueous solution is brought into the supercritical state having a temperature of 390° C. or more and a pressure of 22.1 MPa or more.

7. The method for producing a gallium oxide single crystal particle according to claim 5,
    wherein the aqueous solution includes an alkali metal element.

* * * * *